(12) United States Patent
Chen (10) Patent No.: US 8,279,608 B2
(45) Date of Patent: Oct. 2, 2012

(54) HEATSINK DEVICE DIRECTLY CONTACTING A HEAT SOURCE TO ACHIEVE A QUICK DISSIPATION EFFECT

(76) Inventor: Chuan-Fu Chen, Hemei Township, Changhua County (TW)

( * ) Notice: Subject to any disclaimer, the term of this patent is extended or adjusted under 35 U.S.C. 154(b) by 238 days.

(21) Appl. No.: 12/871,987

(22) Filed: Aug. 31, 2010

(65) Prior Publication Data

US 2012/0050997 A1 Mar. 1, 2012

(51) Int. Cl.
*H05K 7/20* (2006.01)

(52) U.S. Cl. ............. 361/719; 361/679.49; 361/679.54; 361/704; 361/707; 361/720; 174/16.3; 174/252; 257/712; 257/718; 257/723; 165/80.3; 165/104.33; 165/185

(58) Field of Classification Search ............. 361/679.46, 361/679.54, 704–712, 715, 719–722, 760–767, 361/780–795; 165/80.2, 80.3, 80.4, 104.33, 165/104.34, 185; 174/15.1, 15.2, 16.3, 252; 257/706–727; 362/249, 294, 373, 253, 609, 362/632

See application file for complete search history.

(56) References Cited

U.S. PATENT DOCUMENTS

| | | | |
|---|---|---|---|
| 6,262,481 B1 * | 7/2001 | Wang | 257/712 |
| 6,501,103 B1 * | 12/2002 | Jory et al. | 257/100 |
| 6,597,582 B2 * | 7/2003 | Baba | 361/760 |
| 7,192,163 B2 * | 3/2007 | Park | 362/294 |
| 7,399,651 B2 * | 7/2008 | Liu et al. | 438/24 |
| 2007/0108599 A1 * | 5/2007 | Im et al. | 257/712 |
| 2010/0284115 A1 * | 11/2010 | Grundy et al. | 361/91.1 |

* cited by examiner

*Primary Examiner* — Michail V Datskovskiy
(74) *Attorney, Agent, or Firm* — Alan Kamrath; Kamrath IP Lawfirm, PA (57) ABSTRACT

A heatsink device includes an insulating board having at least one periphery, a first face and a second face, at least two conductive plates mounted on at least one of the first face and the second face of the insulating board, and at least one heat source mounted on the insulating board and having two conducting poles conducted with the at least two conductive plates. Thus, the at least two conductive plates are directly connected with the two conducting poles of the at least one heat source so that the at least two conductive plates can carry away the heat produced by the at least one heat source so as to provide a heatsink effect to the at least one heat source.

20 Claims, 11 Drawing Sheets

HEATSINK DEVICE DIRECTLY CONTACTING A HEAT SOURCE TO ACHIEVE A QUICK DISSIPATION EFFECT

BACKGROUND OF THE INVENTION

1. Field of the Invention

The present invention relates to a heatsink device and, more particularly, to a heatsink device for a heat source, such as a light emitting diode (LED).

2. Description of the Related Art

A conventional heatsink device comprises a plurality of heat dissipation fins mounted around a heat source, such as a light emitting diode (LED) and the like, to absorb and carry away the heat produced by the heat source so as to achieve a heat dissipation effect to the heat source. Each of the heat dissipation fins is made of a metal, such as an aluminum or a copper. However, the heat dissipation fins do not directly contact with the heat source so that the heat dissipation fins perform an indirect heat conduction to dissipate the heat produced by the heat source, thereby decreasing the heatsink effect of the heatsink device.

BRIEF SUMMARY OF THE INVENTION

In accordance with the present invention, there is provided a heatsink device, comprising an insulating board having at least one periphery, a first face and a second face, at least two conductive plates mounted on at least one of the first face and the second face of the insulating board, and at least one heat source mounted on the insulating board and having two conducting poles conducted with the at least two conductive plates respectively.

Each of the at least two conductive plates has a side provided with a heat dissipation extension extending from the at least one periphery of the insulating board to enlarge a heat dissipation area of each of the at least two conductive plates. The at least two conductive plates are spaced from each other and are not conducted with each other. Each of the at least two conductive plates is a flexible thin sheet having great heat conductivity and great electrical conductivity. The heat dissipation extension of each of the at least two conductive plates has a bent shape and is bonded onto at least one of the first face and the second face of the insulating board.

The primary objective of the present invention is to provide a heatsink device directly contacting a heat source to achieve a quick dissipation effect.

According to the primary advantage of the present invention, the at least two conductive plates are directly connected with the two conducting poles of the at least one heat source so that the at least two conductive plates can carry away the heat produced by the at least one heat source so as to provide a heatsink effect to the at least one heat source.

According to another advantage of the present invention, each of the at least two conductive plates has a heat dissipation extension extending from the at least one periphery of the insulating board to enlarge the heat dissipation area of each of the at least two conductive plates so that the heat produced by the at least one heat source can be carried away by the heat dissipation extension of each of the at least two conductive plates and can be dissipated to the ambient environment quickly.

According to a further advantage of the present invention, the at least two conductive plates are directly bonded onto the insulating board to touch the at least one heat source so that the heatsink device has a simplified construction and is made easily and quickly, thereby decreasing the costs of fabrication.

According to a further advantage of the present invention, the at least two conductive plates can be bent and deformed to cover the two conducting poles of the at least one heat source completely so that the heat produced by the at least one heat source can be dissipated evenly and smoothly.

Further benefits and advantages of the present invention will become apparent after a careful reading of the detailed description with appropriate reference to the accompanying drawings.

DETAILED DESCRIPTION OF THE INVENTION

Figure 1:
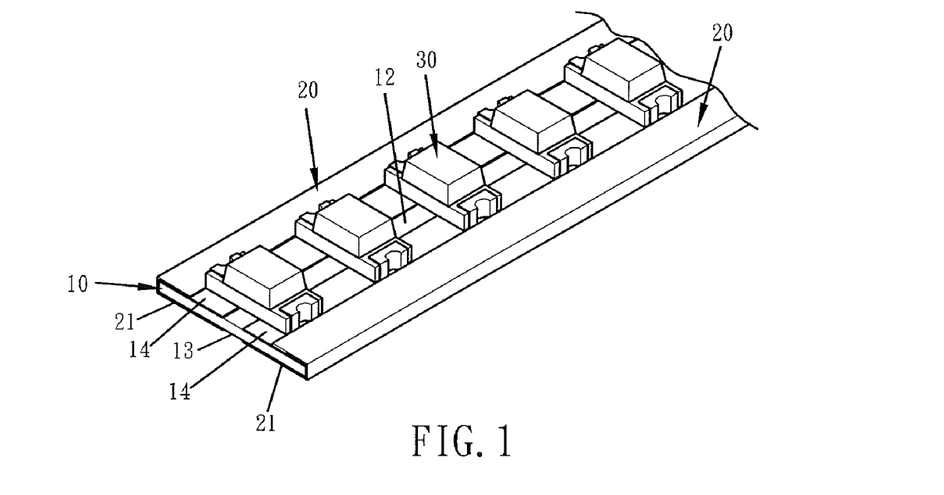
FIG. 1 is a partially perspective view of a heatsink device in accordance with the preferred embodiment of the present invention.
Figure 2:
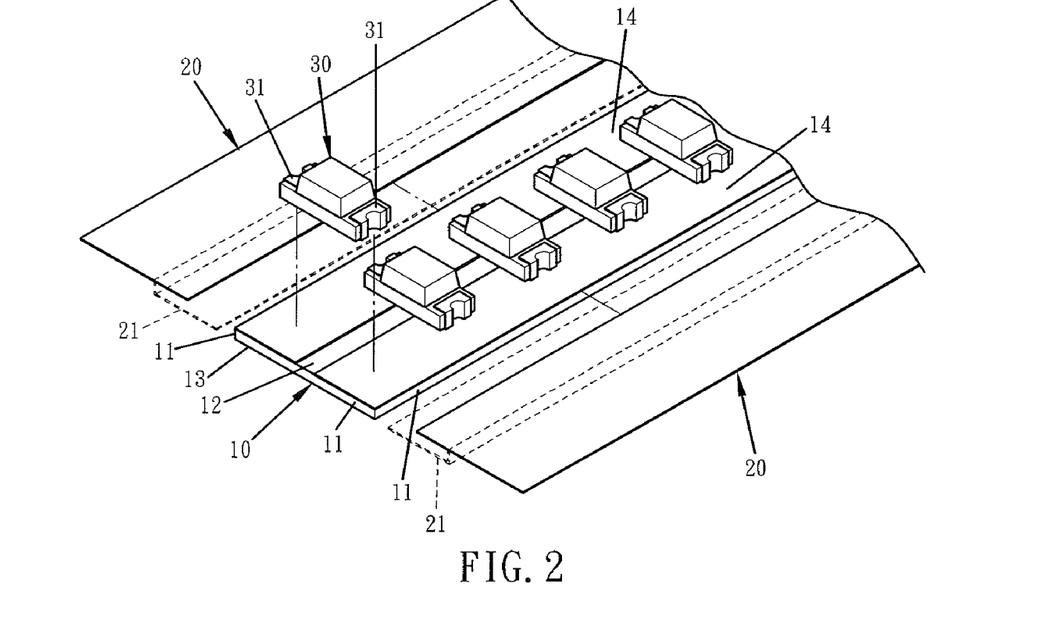
FIG. 2 is a partially exploded perspective view of the heatsink device as shown in FIG. 1.
Figure 3:
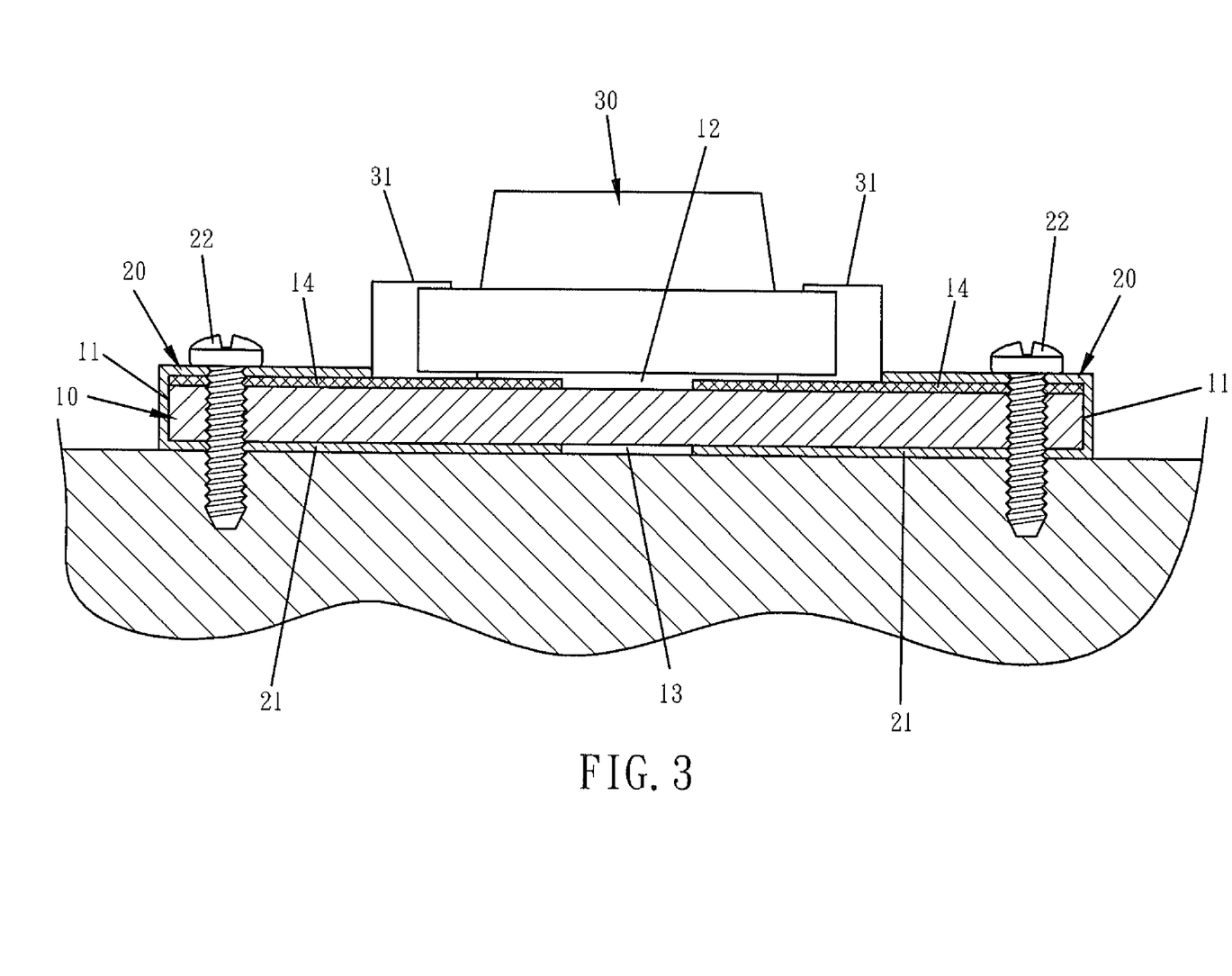
FIG. 3 is a side cross-sectional view of a heatsink device in accordance with another preferred embodiment of the present invention.

Referring to the drawings and initially to FIGS. 1-3, a heatsink device in accordance with the preferred embodiment of the present invention comprises an insulating board 10 having at least one periphery 11, a first face 12 and a second face 13, at least two conductive plates 20 mounted on at least one of the first face 12 and the second face 13 of the insulating board 10, and at least one heat source 30 mounted on the insulating board 10 and having two conducting poles 31 conducted with the at least two conductive plates 20 respectively.

The at least two conductive plates 20 are spaced from each other and are not conducted with each other. Each of the at least two conductive plates 20 is a flexible thin sheet having great heat conductivity and great electrical conductivity. Each of the at least two conductive plates 20 has a side provided with a heat dissipation extension 21 extending from the at least one periphery 11 of the insulating board 10 to enlarge the heat dissipation area of each of the at least two conductive plates 20. The heat dissipation extension 21 of each of the at least two conductive plates 20 has a bent shape and is bonded onto at least one of the first face 12 and the second face 13 of the insulating board 10. The at least two conductive plates 20 are electrically connected with a power supply to supply an electric power to the at least one heat source 30. Thus, the two conducting poles 31 of the at least one heat source 30 are electrically connected with the power supply by the at least two conductive plates 20. In such a manner, the at least two conductive plates 20 are directly connected with the two conducting poles 31 of the at least one heat source 30 so that the at least two conductive plates 20 can carry away the heat produced by the at least one heat source 30 so as to provide a heatsink effect.

In the preferred embodiment of the present invention, each of the at least two conductive plates 20 has a surface provided with an adhesive bonded onto at least one of the first face 12 and the second face 13 of the insulating board 10. Alternatively, each of the at least two conductive plates 20 is fixed on at least one of the first face 12 and the second face 13 of the insulating board 10 by a locking screw 22 as shown in FIG. 3. The locking screw 22 is made of plastics or a metal. When the locking screw 22 is made of a metal, the locking screw 22 has great heat conductivity.

In the preferred embodiment of the present invention, the insulating board 10 is made of a material having great heat conductivity, such as FR4 glass fiber epoxy substrate, FR1 paper substrate, CEM-1 composite substrate, CEM-3 composite substrate, polyester (PET), polyimide (PI), bakelite, plastics, aluminum substrate, graphite, ceramics, silica gel, aluminum oxide or a metal that is insulated after being oxidized.

In the preferred embodiment of the present invention, each of the at least two conductive plates 20 is made of a copper foil, aluminum foil, tin foil, gold foil, silver foil, conducting cloth, conducting foam cotton, conducting gel, silica gel, epoxy resin, aluminum oxide, zinc oxide, aluminum alloy, copper alloy, magnesium alloy, aluminum and magnesium alloy, copper-aluminum and magnesium alloy and the like.

In the preferred embodiment of the present invention, the at least one heat source 30 is preferably a light emitting diode (LED).

In the preferred embodiment of the present invention, the heatsink device further comprises at least two conducting layers 14 mounted on at least one of the first face 12 and the second face 13 of the insulating board 10 and connected with the at least two conductive plates 20 respectively. Each of the at least two conducting layers 14 is sandwiched between the insulating board 10 and a respective one of the at least two conductive plates 20. The at least two conducting layers 14 are connected with the two conducting poles 31 of the at least one heat source 30 respectively, and the at least two conductive plates 20 are connected with the at least two conducting layers 14 respectively and are connected with the two conducting poles 31 of the at least one heat source 30 respectively. The at least two conducting layers 14 are electrically connected with a power supply to supply an electric power to the at least one heat source 30. Thus, the two conducting poles 31 of the at least one heat source 30 are electrically connected with the power supply by the at least two conducting layers 14. In such a manner, the at least two conductive plates 20 are directly connected with the two conducting poles 31 of the at least one heat source 30 so that the at least two conductive plates 20 can carry away the heat produced by the at least one heat source 30 so as to provide a heatsink effect.

Figure 4:
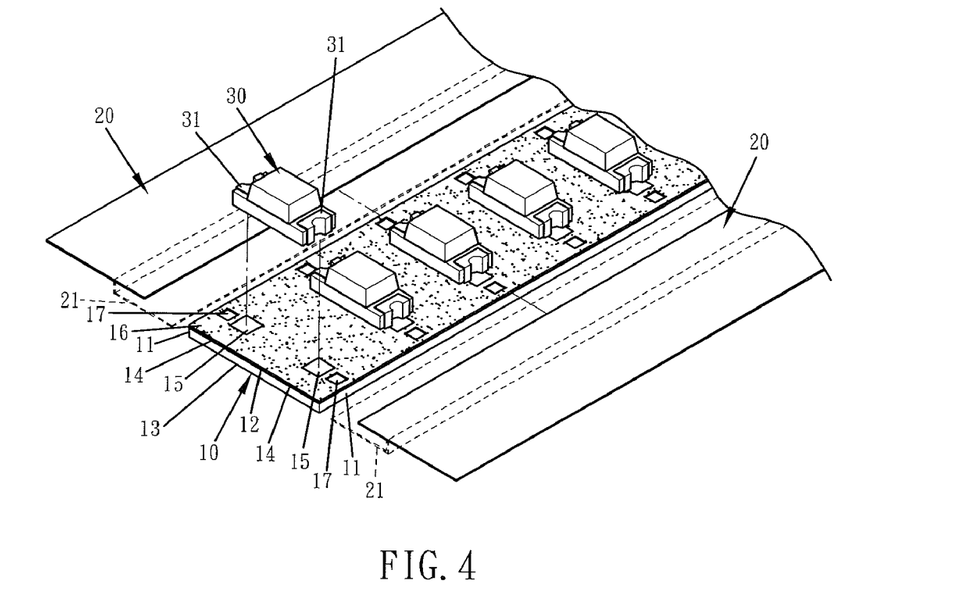
FIG. 4 is a partially exploded perspective view of a heatsink device in accordance with another preferred embodiment of the present invention.
Figure 5:
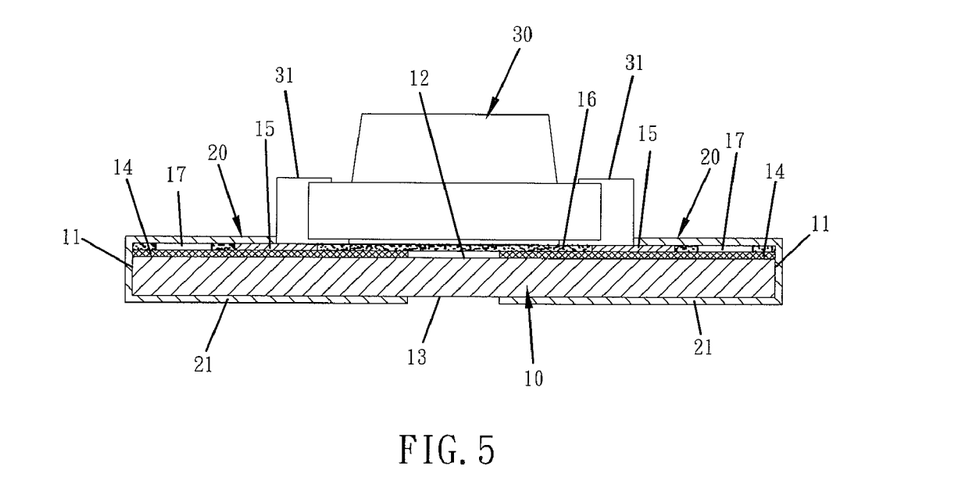
FIG. 5 is a side cross-sectional assembly view of the heatsink device as shown in FIG. 4.

Referring to FIGS. 4 and 5, the heatsink device further comprises an insulating separation layer 16 mounted on the at least two conducting layers 14 to cover the at least two conducting layers 14, and at least two soldering pads 15 each mounted in the insulating separation layer 16 and each connected between a respective one of the at least two conducting layers 14 and a respective one of the two conducting poles 31 of the at least one heat source 30. The insulating separation layer 16 is located between the at least two conducting layers 14 and the at least two conductive plates 20, and each of the at least two conducting layers 14 is located between the insulating separation layer 16 and the insulating board 10. The insulating separation layer 16 has a surface formed with a plurality of heatsink holes 17 connected between the at least two conducting layers 14 and the at least two conductive plates 20. Each of the heatsink holes 17 is filled with a heat conductive medium, such as heat conductive gel, heat conductive paste, heat conductive oil and the like.

Figure 6:
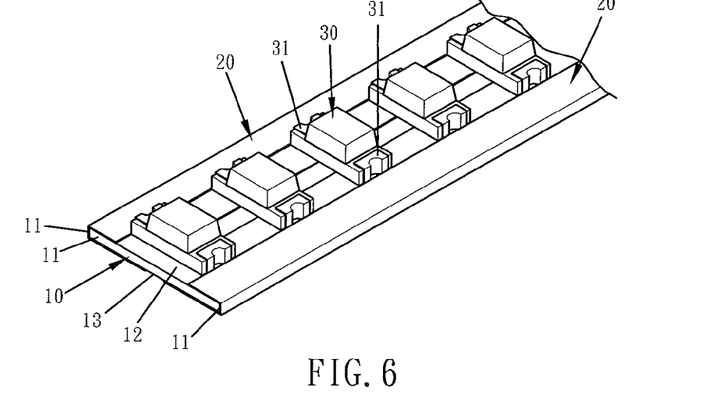
FIG. 6 is a partially perspective view of a heatsink device in accordance with another preferred embodiment of the present invention.
Figure 7:
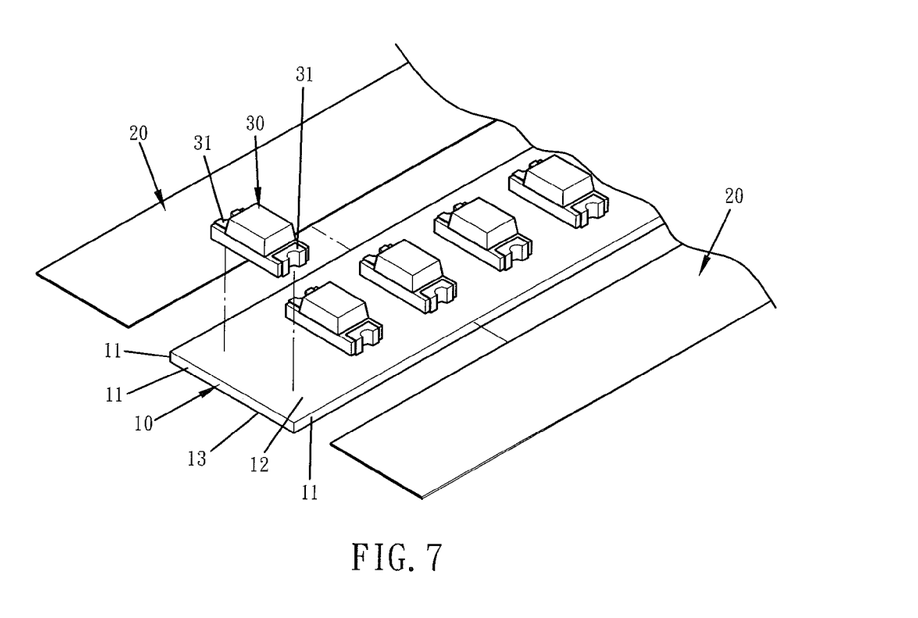
FIG. 7 is a partially exploded perspective view of the heatsink device as shown in FIG. 6.
Figure 8:
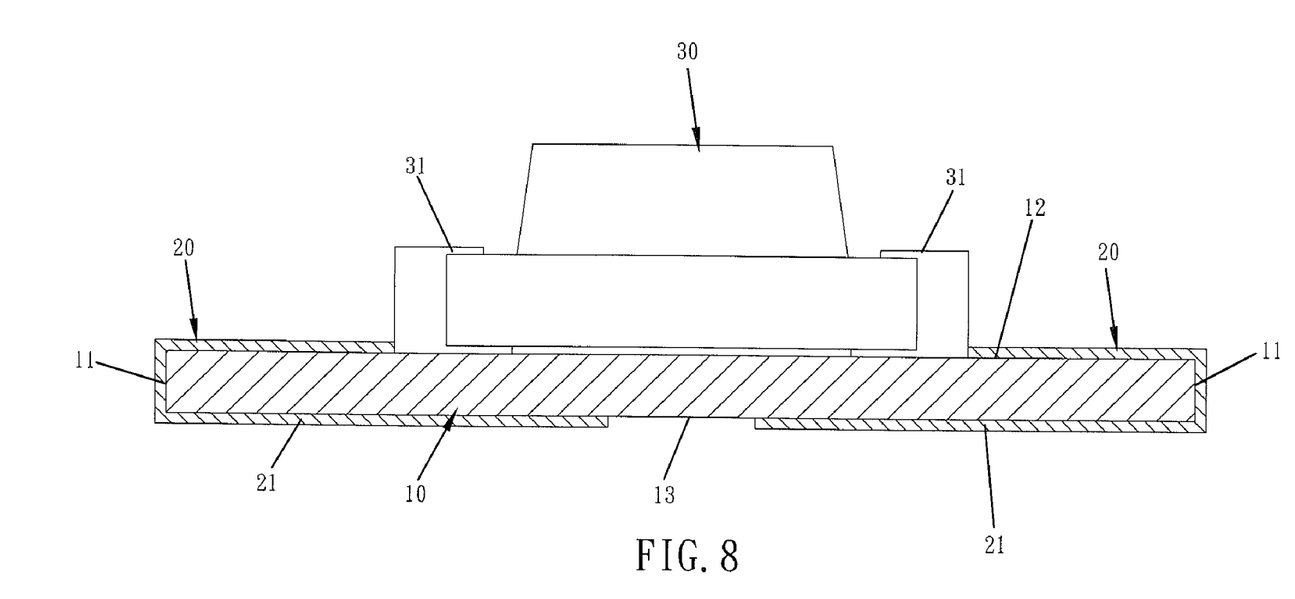
FIG. 8 is a side cross-sectional view of the heatsink device as shown in FIG. 6.

Referring to FIGS. 6-8, the at least two conducting layers 14 are undefined, and the two conducting poles 31 of the at least one heat source 30 are connected and directly conducted with the at least two conductive plates 20 respectively.

As shown in FIG. 8, each of the at least two conductive plates 20 is spaced from the at least one heat source 30.

Figure 9:
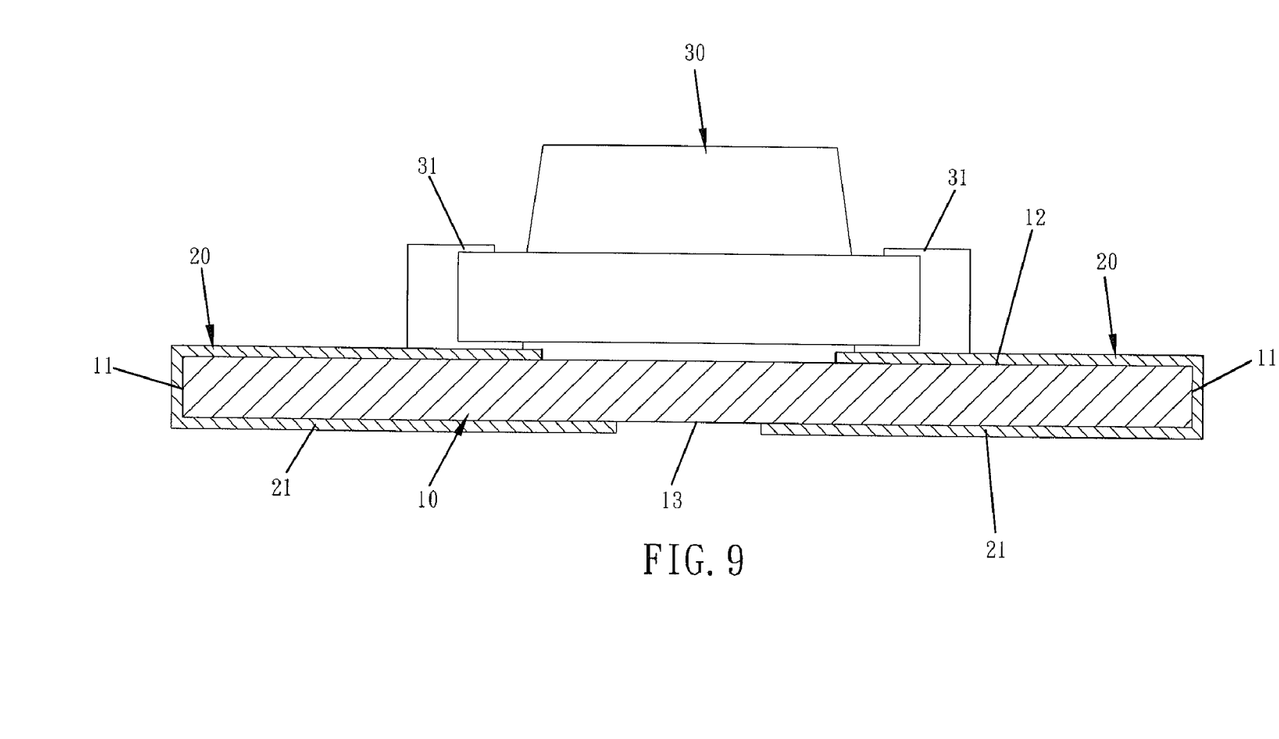
FIG. 9 is a side cross-sectional view of a heatsink device in accordance with another preferred embodiment of the present invention.

As shown in FIG. 9, each of the at least two conductive plates 20 is directly connected with the at least one heat source 30.

Figure 10:
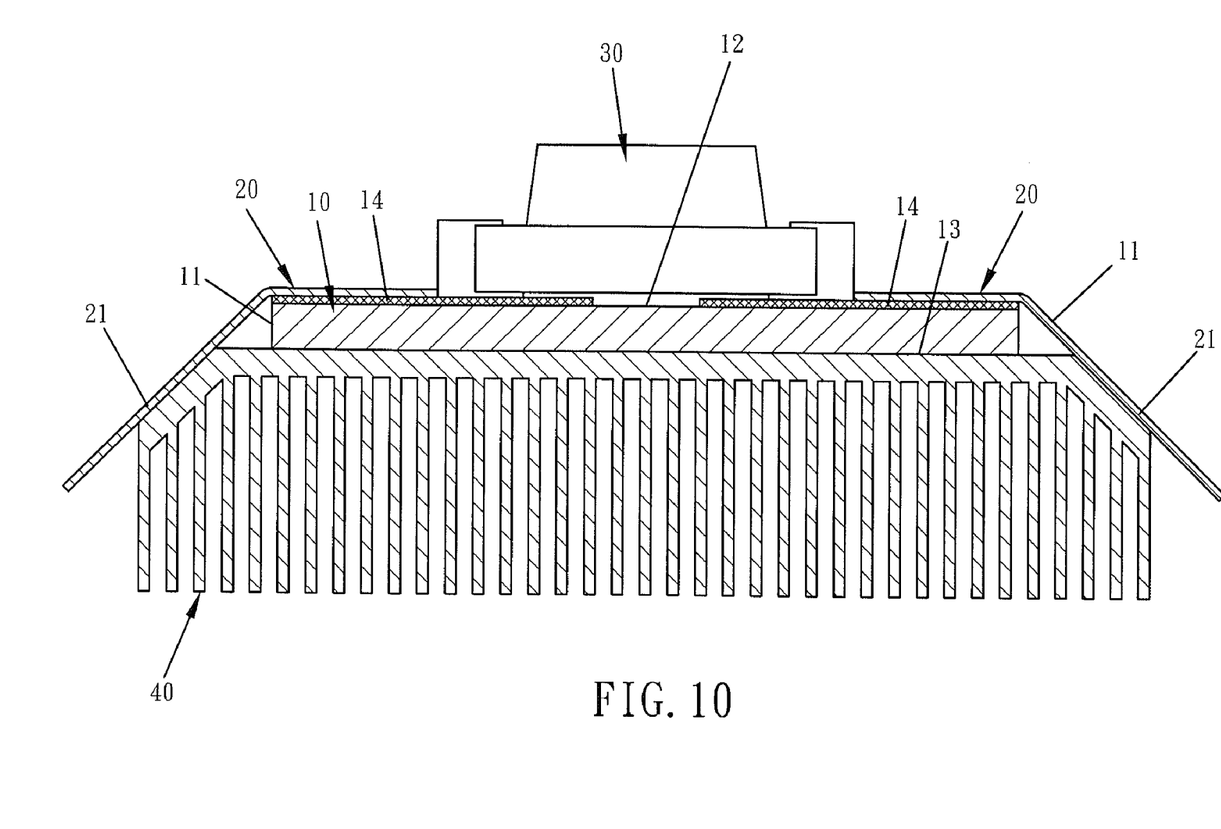
FIG. 10 is a side cross-sectional view of a heatsink device in accordance with another preferred embodiment of the present invention.
Figure 11:
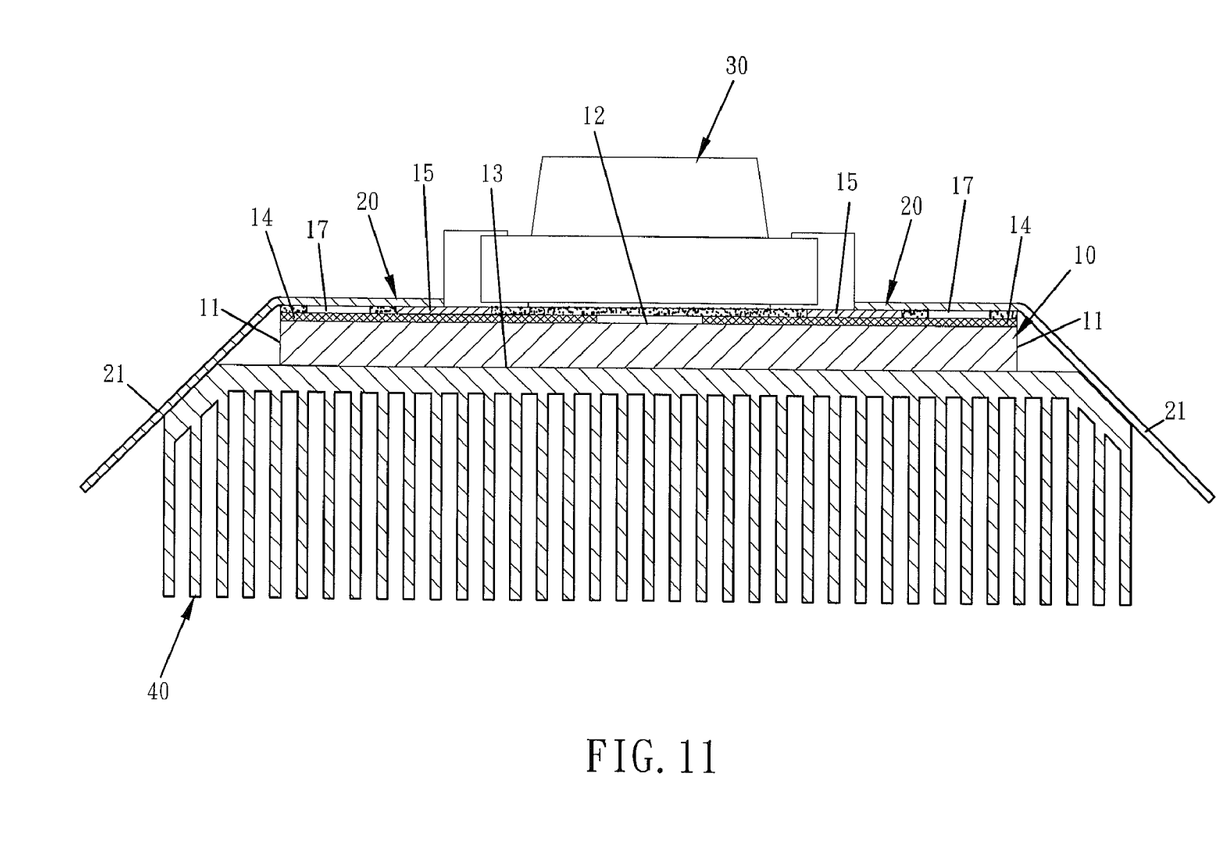
FIG. 11 is a side cross-sectional view of a heatsink device in accordance with another preferred embodiment of the present invention.
Figure 12:
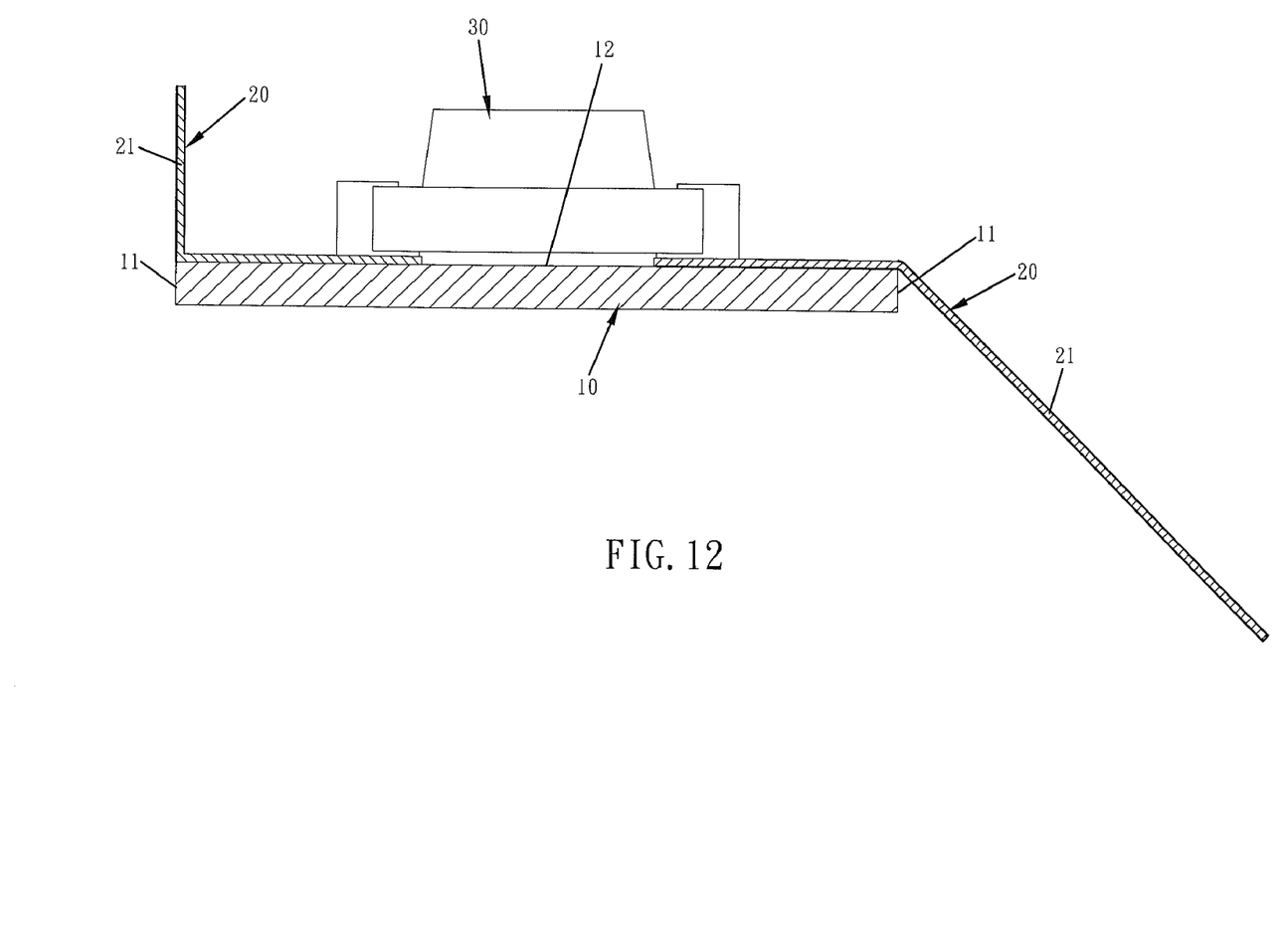
FIG. 12 is a side cross-sectional view of a heatsink device in accordance with another preferred embodiment of the present invention.
Figure 13:
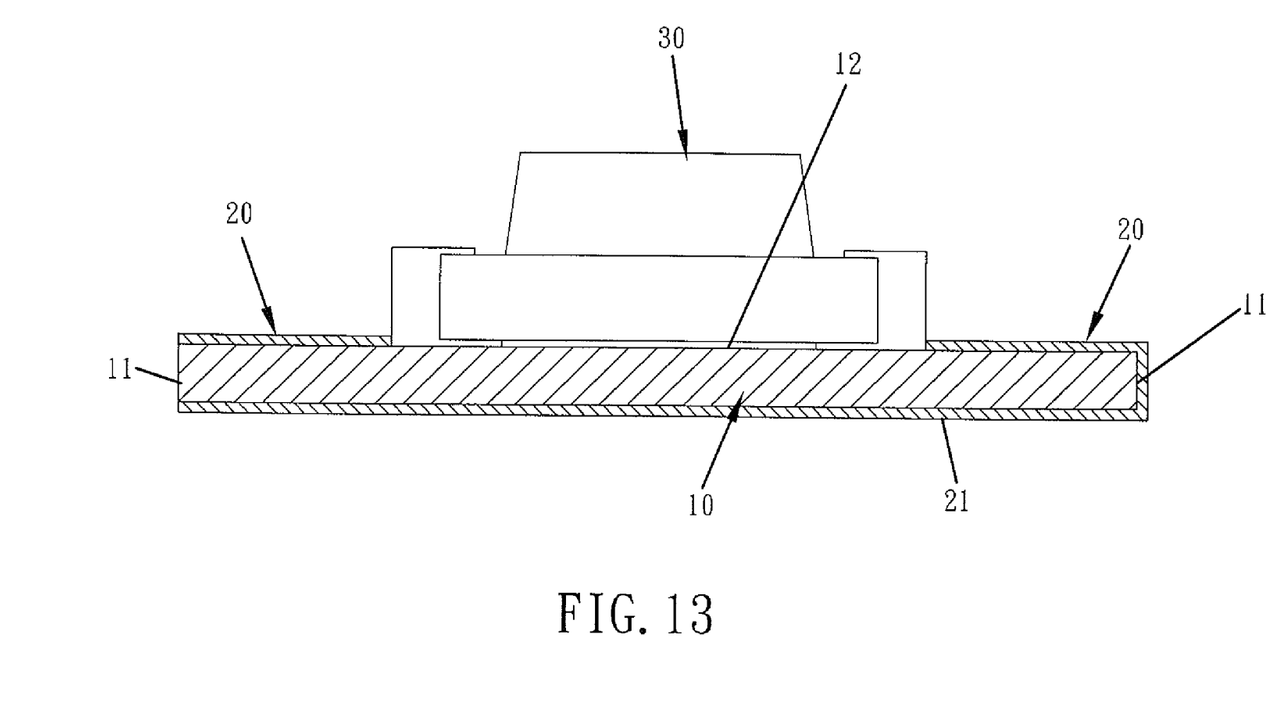
FIG. 13 is a side cross-sectional view of a heatsink device in accordance with another preferred embodiment of the present invention.
Figure 14:
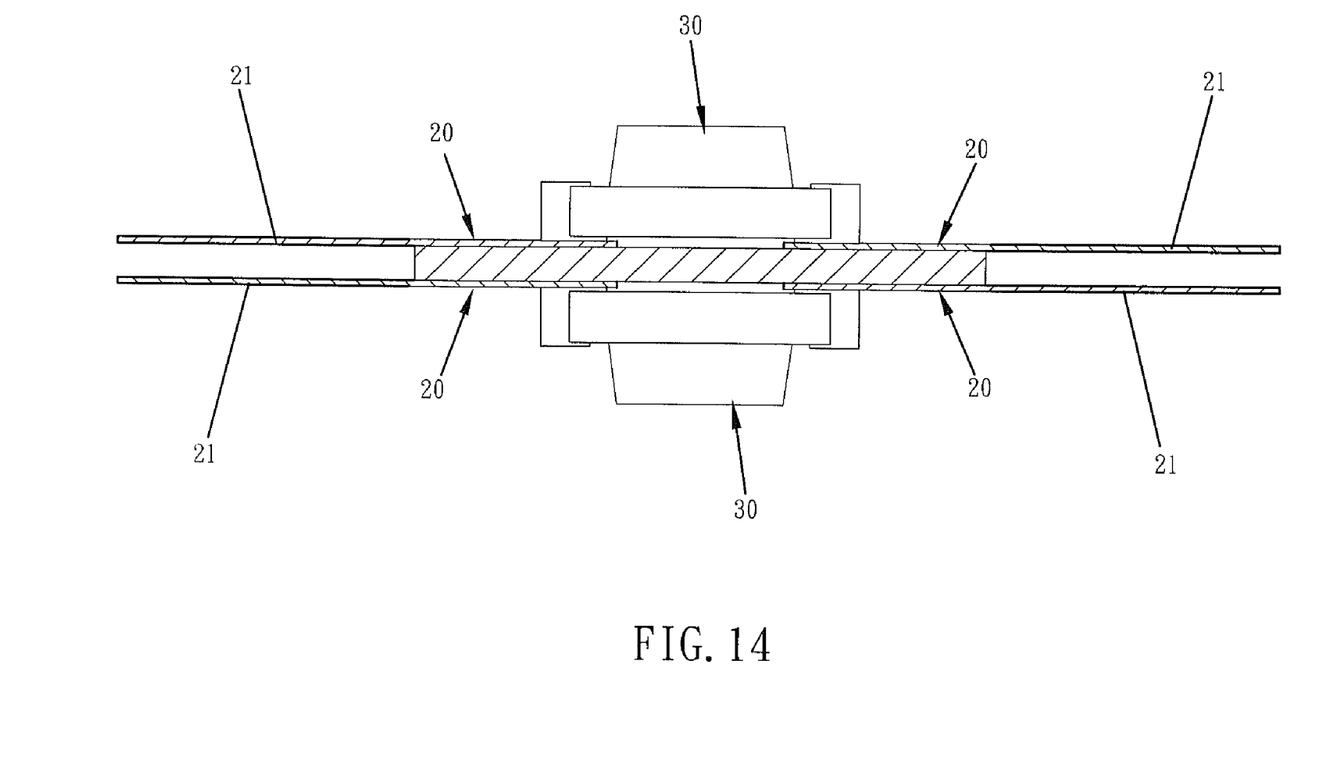
FIG. 14 is a side cross-sectional view of a heatsink device in accordance with another preferred embodiment of the present invention.

Referring to FIGS. 10 and 11, the heatsink device further comprises a heatsink fin module 40 combined with the insulating board 10 and the at least two conductive plates 20. Preferably, the heatsink fin module 40 is combined with the heat dissipation extension 21 of each of the at least two conductive plates 20.

As shown in FIGS. 10-14, the heat dissipation extension 21 of each of the at least two conductive plates 20 has different shapes and arrangements.

Accordingly, the at least two conductive plates 20 are directly connected with the two conducting poles 31 of the at least one heat source 30 so that the at least two conductive plates 20 can carry away the heat produced by the at least one heat source 30 so as to provide a heatsink effect to the at least one heat source 30. In addition, each of the at least two conductive plates 20 has a heat dissipation extension 21 extending from the at least one periphery 11 of the insulating board 10 to enlarge the heat dissipation area of each of the at least two conductive plates 20 so that the heat produced by the at least one heat source 30 can be carried away by the heat dissipation extension 21 of each of the at least two conductive plates 20 and can be dissipated to the ambient environment quickly. Further, the at least two conductive plates 20 are directly bonded onto the insulating board 10 to touch the at least one heat source 30 so that the heatsink device has a simplified construction and is made easily and quickly, thereby decreasing the costs of fabrication. Further, the at least two conductive plates 20 can be bent and deformed to cover the two conducting poles 31 of the at least one heat source 30 completely so that the heat produced by the at least one heat source 30 can be dissipated evenly and smoothly.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

The invention claimed is:

1. A heatsink device, comprising:
   an insulating board having at least one periphery, a first face and a second face;
   at least two conductive plates mounted on at least one of the first face and the second face of the insulating board; and
   at least one heat source mounted on the insulating board and having two conducting poles conducted with the at least two conductive plates respectively.

2. The heatsink device of claim 1, wherein each of the at least two conductive plates has a side provided with a heat dissipation extension extending from the at least one periphery of the insulating board to enlarge a heat dissipation area of each of the at least two conductive plates.

3. The heatsink device of claim 1, wherein the at least two conductive plates are spaced from each other and are not conducted with each other.

4. The heatsink device of claim 1, wherein each of the at least two conductive plates is a flexible thin sheet having great heat conductivity and great electrical conductivity.

5. The heatsink device of claim 4, wherein the heat dissipation extension of each of the at least two conductive plates has a bent shape and is bonded onto at least one of the first face and the second face of the insulating board.

6. The heatsink device of claim 1, wherein each of the at least two conductive plates is fixed on at least one of the first face and the second face of the insulating board by a locking screw.

7. The heatsink device of claim 1, wherein each of the at least two conductive plates has a surface provided with an adhesive bonded onto at least one of the first face and the second face of the insulating board.

8. The heatsink device of claim 1, wherein the heatsink device further comprises:
   at least two conducting layers mounted on at least one of the first face and the second face of the insulating board and connected with the at least two conductive plates respectively.

9. The heatsink device of claim 8, wherein each of the at least two conducting layers is sandwiched between the insulating board and a respective one of the at least two conductive plates.

10. The heatsink device of claim 8, wherein
    the at least two conducting layers are connected with the two conducting poles of the at least one heat source respectively;
    the at least two conductive plates are connected with the at least two conducting layers respectively and are connected with the two conducting poles of the at least one heat source respectively.

11. The heatsink device of claim 8, wherein
    the at least two conducting layers are electrically connected with a power supply to supply an electric power to the at least one heat source;
    the two conducting poles of the at least one heat source are electrically connected with the power supply by the at least two conducting layers;
    the at least two conductive plates are directly connected with the two conducting poles of the at least one heat source.

12. The heatsink device of claim 8, wherein the heatsink device further comprises:
    an insulating separation layer mounted on the at least two conducting layers to cover the at least two conducting layers;
    at least two soldering pads each mounted in the insulating separation layer and each connected between a respective one of the at least two conducting layers and a respective one of the two conducting poles of the at least one heat source.

13. The heatsink device of claim 12, wherein
    the insulating separation layer is located between the at least two conducting layers and the at least two conductive plates;
    each of the at least two conducting layers is located between the insulating separation layer and the insulating board.

14. The heatsink device of claim 12, wherein
    the insulating separation layer has a surface formed with a plurality of heatsink holes connected between the at least two conducting layers and the at least two conductive plates;
    each of the heatsink holes is filled with a heat conductive medium, such as heat conductive gel, heat conductive paste or heat conductive oil.

15. The heatsink device of claim 2, wherein the heatsink device further comprises:
    a heatsink fin module combined with the insulating board and the at least two conductive plates;
    the heatsink fin module is combined with the heat dissipation extension of each of the at least two conductive plates.

16. The heatsink device of claim 1, wherein the insulating board is made of a material having great heat conductivity, including FR4 glass fiber epoxy substrate, FR1 paper substrate, CEM-1 composite substrate, CEM-3 composite substrate, polyester (PET), polyimide (PI), bakelite, plastics, aluminum substrate, graphite, ceramics, silica gel, aluminum oxide or a metal that is insulated after being oxidized.

17. The heatsink device of claim 1, wherein each of the at least two conductive plates is made of a copper foil, aluminum foil, tin foil, gold foil, silver foil, conducting cloth, conducting foam cotton, conducting gel, silica gel, epoxy resin, aluminum oxide, zinc oxide, aluminum alloy, copper alloy, magnesium alloy, aluminum and magnesium alloy or copper-aluminum and magnesium alloy.

18. The heatsink device of claim 1, wherein the at least one heat source is a light emitting diode (LED).

19. The heatsink device of claim 1, wherein each of the at least two conductive plates is spaced from the at least one heat source.

20. The heatsink device of claim 1, wherein each of the at least two conductive plates is directly connected with the at least one heat source.

* * * * *